United States Patent
Morton et al.

(10) Patent No.: US 6,560,263 B1
(45) Date of Patent: May 6, 2003

(54) DISCHARGE LASER HAVING ELECTRODES WITH SPUTTER CAVITIES AND DISCHARGE PEAKS

(75) Inventors: Richard G. Morton, San Diego, CA (US); Zsolt Bor, San Diego, CA (US); Eckehard D. Onkels, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 208 days.

(21) Appl. No.: 09/590,958

(22) Filed: Jun. 9, 2000

(51) Int. Cl.[7] ............... H01S 3/22; H01S 3/097
(52) U.S. Cl. ............... 372/87; 372/55; 372/57
(58) Field of Search ............... 372/58, 61, 29.013

(56) References Cited

U.S. PATENT DOCUMENTS

| | | | |
|---|---|---|---|
| 4,245,194 A | 1/1981 | Fahlen et al. | 331/94.5 |
| 4,414,488 A | 11/1983 | Hoffmann et al. | 315/39 |
| 4,546,482 A | 10/1985 | Bagaglia et al. | 372/86 |
| 4,686,682 A | 8/1987 | Haruta et al. | 372/87 |
| 4,703,490 A | 10/1987 | Brumme et al. | 372/86 |
| 4,774,714 A | 9/1988 | Javan | 372/109 |
| 4,876,693 A | 10/1989 | Lucero et al. | 372/82 |
| 4,959,840 A | 9/1990 | Akins et al. | 372/57 |
| 5,070,513 A | 12/1991 | Letardi | 372/83 |
| 5,187,716 A * | 2/1993 | Haruta | 372/57 |
| 5,535,233 A | 7/1996 | Mizoguchi et al. | 372/87 |
| 5,557,629 A | 9/1996 | Mizoguchi et al. | 372/87 |
| 5,771,258 A | 6/1998 | Morton et al. | 372/57 |
| 6,038,055 A | 3/2000 | Hänsch et al. | 359/279 |
| 6,208,675 B1 * | 3/2001 | Webb | 372/58 |

FOREIGN PATENT DOCUMENTS

JP  2631607  7/1997  ............... 3/38

* cited by examiner

Primary Examiner—Paul Ip
Assistant Examiner—Armando Rodriguez

(57) ABSTRACT

A gas discharge laser having a laser chamber with two elongated electrode elements, each having a discharge section having an optimum array of discharge peaks and sputter cavities. The sputter cavities provide sputter metal ions to contribute to a plasma between the electrodes and support a glow-type discharge. The peaks provide very high fields which produce a very large number of filament-type discharges. The electrodes erode gradually but since the discharge region is confined to the array of discharge peaks and sputter cavities, the shape of he discharge remains approximately constant for billions of pulses. A pulse power system provides electrical pulses of at least 2J at rates of at least 1 KHz. A blower circulates laser gas between the electrodes at speeds of at least 5 m/s and a heat exchanger is provided to remove heat produced by the blower and the discharges.

36 Claims, 15 Drawing Sheets

DISCHARGE LASER HAVING ELECTRODES WITH SPUTTER CAVITIES AND DISCHARGE PEAKS

This invention relates to electric discharge lasers and in particular to such lasers having chambers with long life electrodes.

BACKGROUND OF THE INVENTION

The principal components of a prior art KrF excimer laser chambers are shown in FIG. 1. This chamber is a part of a laser system used as a light source for integrated circuit lithography. These components include a chamber housing 2. The housing contains two electrodes 84 and 83 each about 50 cm long and spaced apart by about 20 mm, a blower 4 for circulating a laser gas between the electrodes at velocities fast enough to clear (from a discharge region between the two electrodes) debris from one pulse prior to the next succeeding pulse at a pulse repetition rate in the range of 1000 Hz or greater, and a water cooled finned heat exchanger 6 for removing heat added to the laser gas by the fan and by electric discharges between the electrodes. The word "debris" is used here to define any physical condition of the gas after a laser pulse which is different from the condition of the gas prior to said pulse. The chamber may also include baffles and vanes for improving the aerodynamic geometry of the chamber. The laser gas is comprised of a mixture of about 0.1 percent fluorine, about 1.0 percent krypton and the rest neon. Each pulse is produced by applying a very high voltage potential across the electrodes with a pulse power supply 8 which causes a discharge between the electrodes lasting about 30 nanoseconds to produce a gain region about 20 mm high, 3 mm wide and 500 mm long. The discharge deposits about 2.5 J of energy into the gain region. As shown in FIG. 2, lasing is produced in a resonant cavity, defined by an output coupler 2A and a grating based line narrowing unit (called a line narrowing package or LNP, shown disproportionately large) 2B comprising a three prism beam expander, a tuning mirror and a grating disposed in a Littrow configuration. The energy of the output pulse 3 in this prior art KrF lithography laser is typically about 10 mJ.

There are many industrial applications of electric discharge lasers. One important use is as the light source for integrated circuit lithography machines. One such laser light source is the line narrowed KrF laser described above which produces a narrow band pulsed ultraviolet light beam at about 248 nm. These lasers typically operate in bursts of pulses at pulse rates of about 1000 to 4000 Hz. Each burst consists of a number of pulses, for example, about 80 pulses, one burst illuminating a single die section on a wafer with the bursts separated by off times of a fraction of a second while the lithography machine shifts the illumination between die sections. There is another off time of a few seconds when a new wafer is loaded. Therefore, in production, for example, a 2000 Hz, KrF excimer laser may operate at a duty factor of about 30 percent. The operation is 24 hours per day, seven days per week, 52 weeks per year. A laser operating at 2000 Hz "around the clock" at a 30 percent duty factor will accumulate more than 1.5 billion pulses per month. Any disruption of production can be extremely expensive. For these reasons, prior art excimer lasers designed for the lithography industry are modular so that maintenance down time is minimized.

Maintaining high quality of the laser beam produced by these lasers is very important because the lithography systems in which these laser light sources are used are currently required to produce integrated circuits with features smaller than 0.25 microns and feature sizes get smaller each year. As a result the specifications placed on the laser beam limit the variation in individual pulse energy, the variation of the integrated energy of series of pulses, the variation of the laser wavelength and the magnitude of the bandwidth of the laser beam.

Typical operation of electric discharge lasers such as that depicted in FIG. 1 causes electrode erosion. Erosion of these electrodes affects the shape of the discharge which in turn affects the quality of the output beam as well as the laser efficiency. Electrode designs have been proposed which are intended to minimize the effects of erosion by providing on the electrode a protruding part having the same width as the discharge. Some examples are described in Japanese Patent No. 2631607. These designs, however, produce adverse effects on gas flow. In these gas discharge lasers, it is very important that virtually all effects of each pulse be blown out of the discharge region prior to the next pulse.

What is needed is a gas discharge laser having erodable electrodes which do not adversely affect gas flow and can withstand many billions of pulses without adversely affecting laser beam quality.

SUMMARY OF THE INVENTION

The present invention provides a gas discharge laser having a laser chamber with two elongated electrode elements, each having a discharge section having an optimum array of discharge peaks and sputter cavities. The sputter cavities provide sputter metal ions to contribute to a plasma between the electrodes and support a glow-type discharge. The peaks provide very high fields which produce a very large number of filament-type discharges. The electrodes erode gradually but since the discharge region is confined to the array of discharge peaks and sputter cavities, the shape of the discharge remains approximately constant for billions of pulses. A pulse power system provides electrical pulses of at least 2J at rates of at least 1 KHz. A blower circulates laser gas between the electrodes at speeds of at least 5 m/s and a heat exchanger is provided to remove heat produced by the blower and the discharges.

DETAILED DESCRIPTION OF PREFERRED EMBODIMENTS

Pulse Power Supply System

Figure 3:
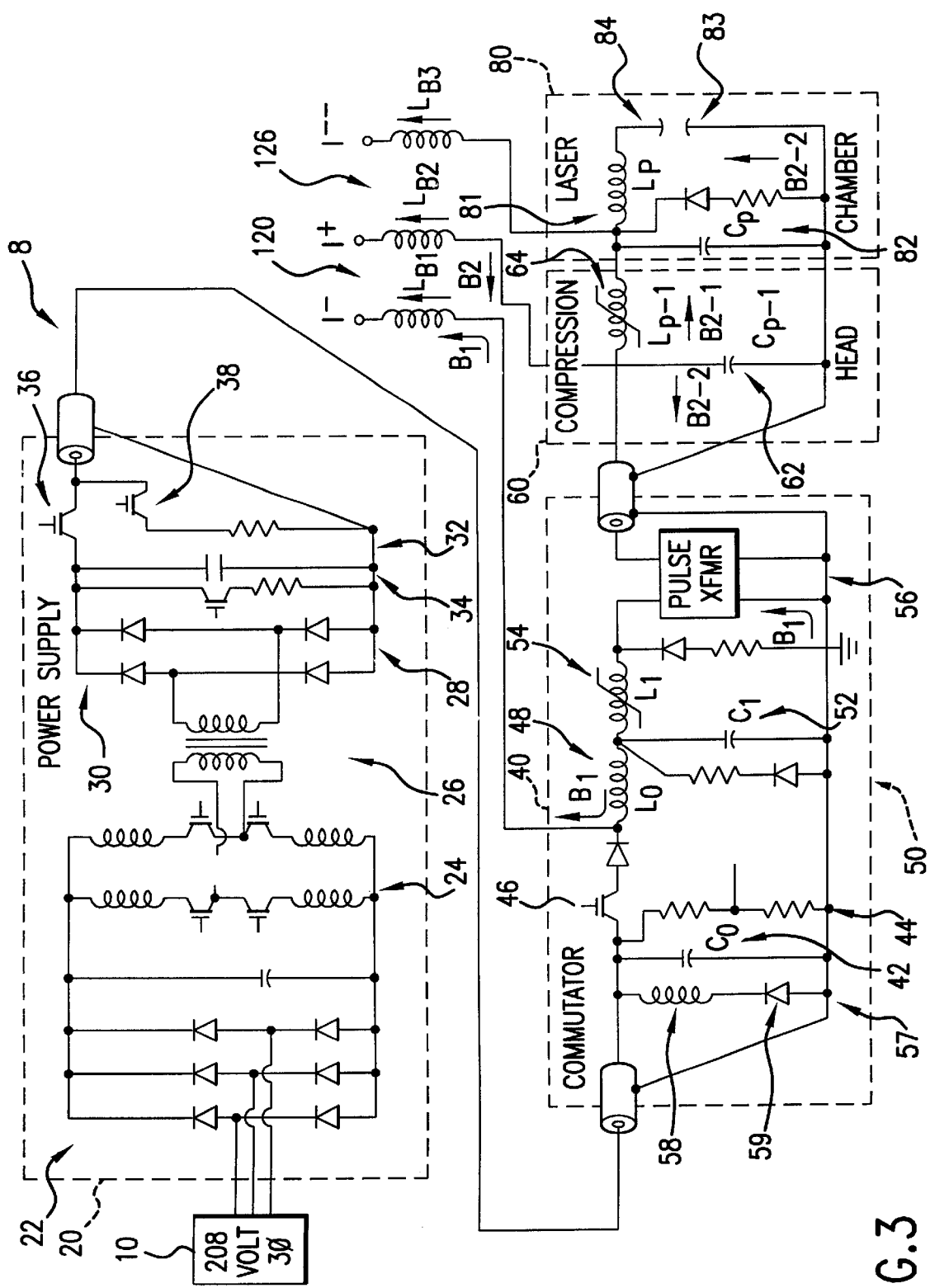
FIG. 3 shows the principal features of a pulse power system of a prior-art gas discharge laser.

The principal components of an electrical circuit 8 for providing pulse power to produce electrical discharges in a gas discharge laser are shown in FIG. 3. The pulse power system operates from a standard 208-volt, 3 phase electrical source. A power supply using rectifier 22, inverter 24, transformer 26 and rectifier 30 charges charging capacitor $C_0$ 42 to a voltage level between about 500 to 1200 volts as directed by a laser control processor (not shown). The laser control processor directs the closing of an IGBT switch 46 when a pulse is desired which causes the energy on $C_0$ to be discharged into the follow-on portions of the pulse power system. The charge on $C_0$ is transferred successively to capacitor bank $C_1$ 52 through inductor 48 then through saturable inductor 54 and through voltage transformer 56 to capacitor bank $C_{p-1}$ 62 and then through saturable inductor 64 to peaking capacitor bank $C_p$ 82. As shown in FIG. 3, peaking capacitor bank $C_p$ is connected electrically in parallel with electrodes 84 and 83.

Figure 4A:
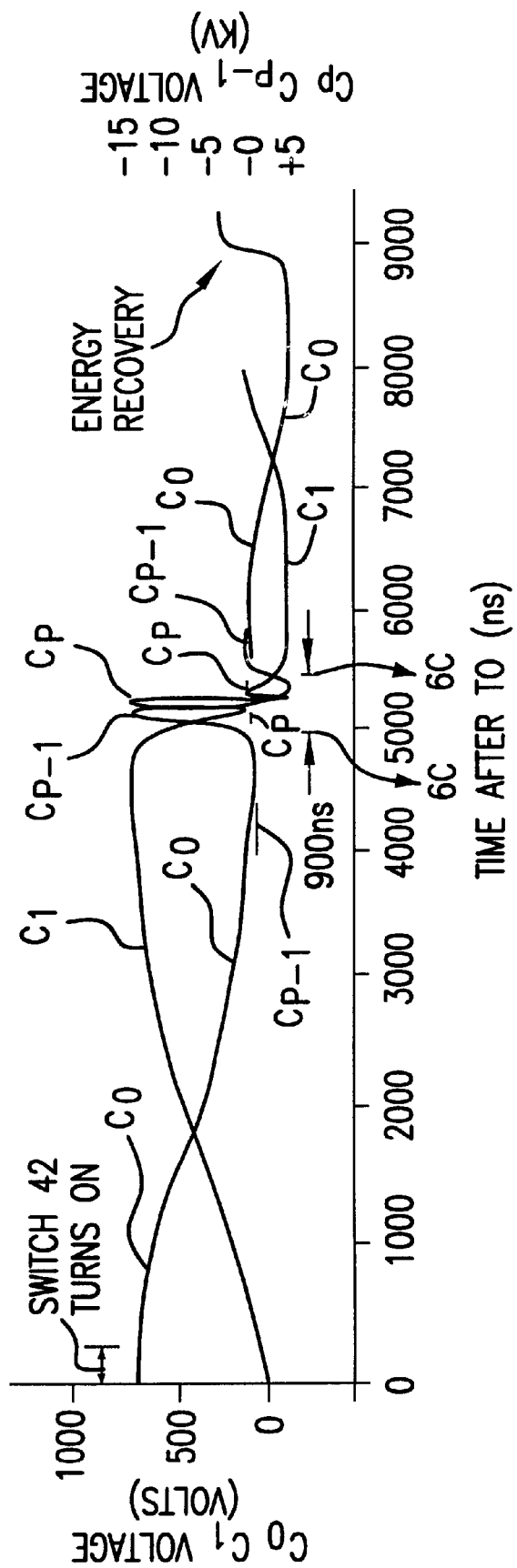
FIGS. 4A and 4B show electrical pulse shapes on the FIG. 3 pulse power system.
Figure 4B:
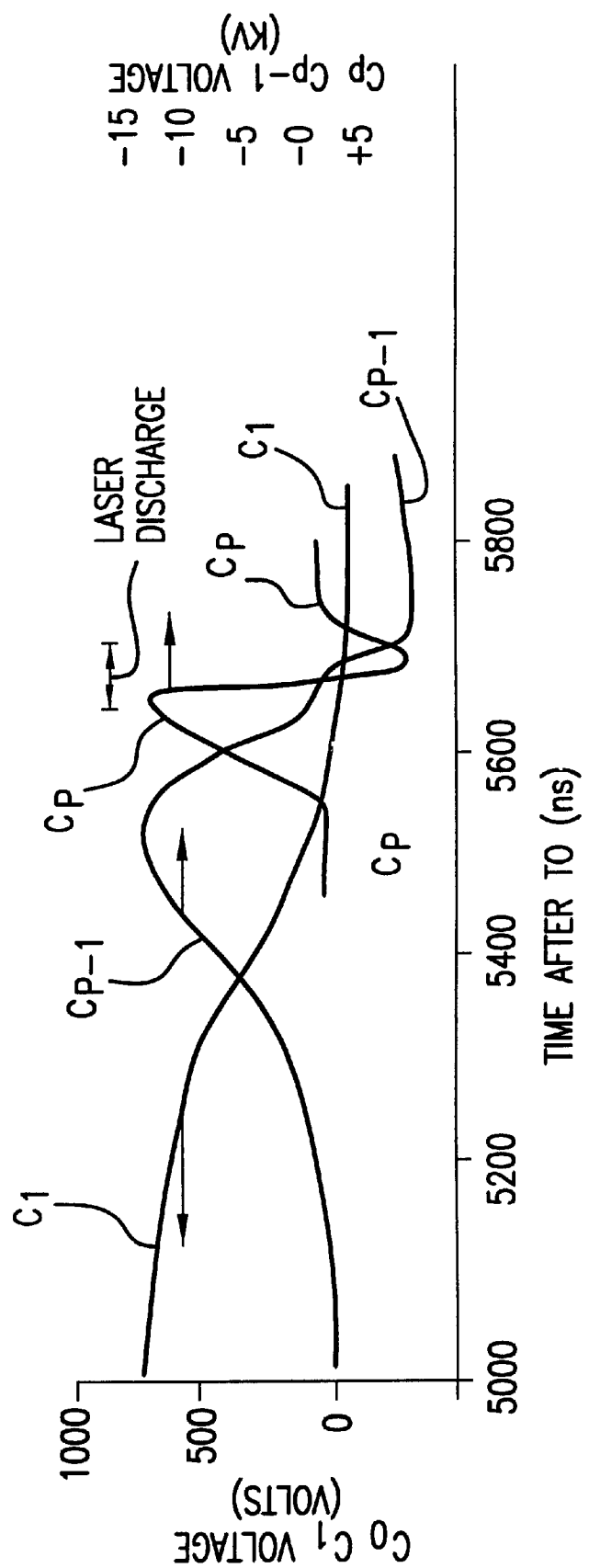

FIG. 4A shows the potential on capacitor banks $C_0$, $C_1$, $C_{p-1}$ and $C_p$ as a function of time beginning with the closing of switch 42 and for the following 9 microseconds. FIG. 4B shows an 800 ns time slice just before and after the discharge. The reader should note that the peaking capacitor bank $C_p$ is charged to approximately −15,000 V just prior to the discharge. The discharge lasts about 30 ns. During the discharge, the electron flow is first from the upper electrode, cathode 84 to the lower grounded electrode, anode 83. A current "overshoot" charges $C_p$ to a positive value of about +6,000 V at which time the downward flow of electrons is reversed after which the electron flow is from the lower grounded electrode to the upper electrode during the last approximately 15 ns of the discharge, all as shown in FIG. 4B.

New Electrode

Figure 1:
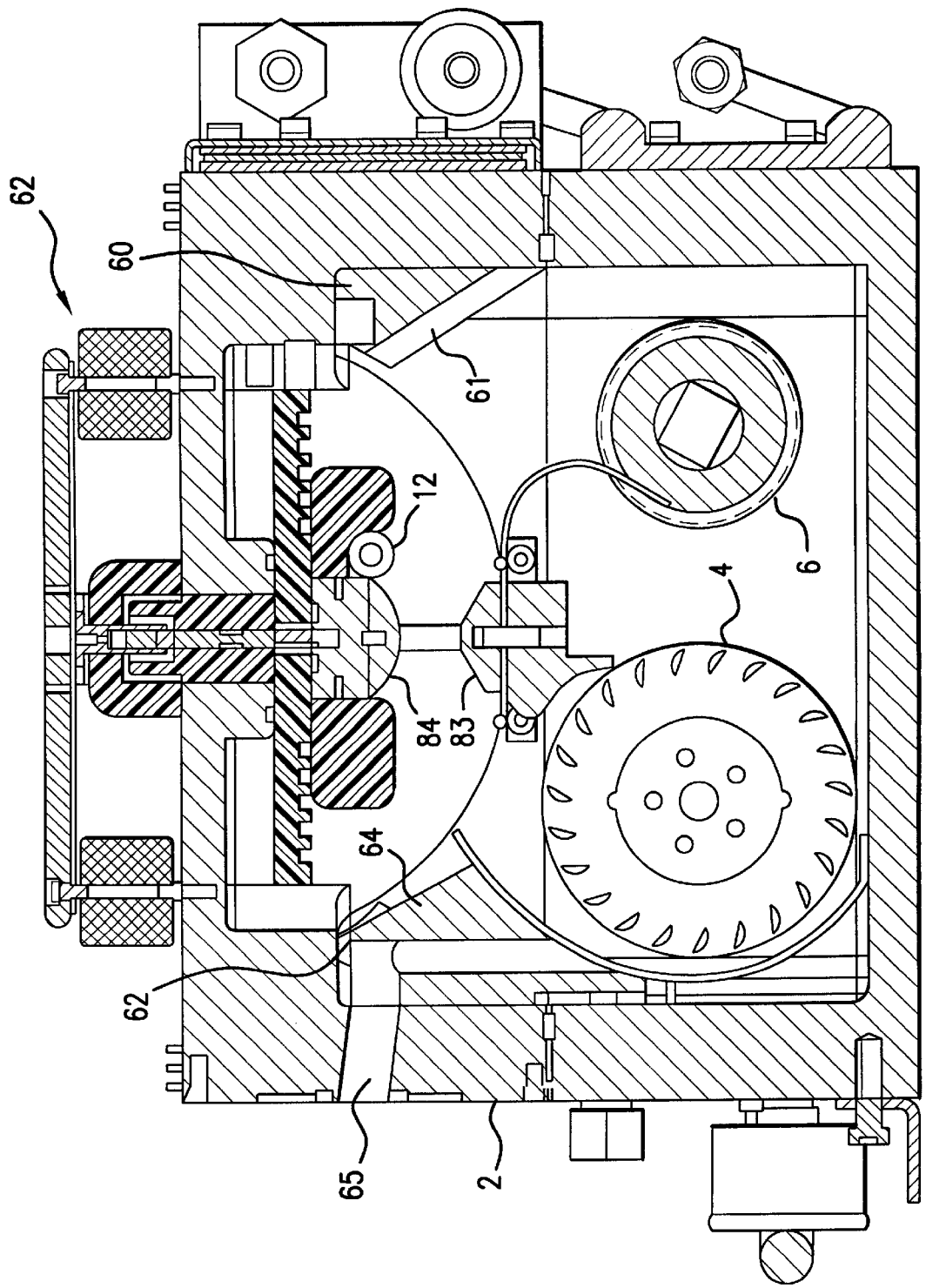
FIG. 1 shows a cross section of a chamber of a prior-art gas discharge laser.
Figure 2:
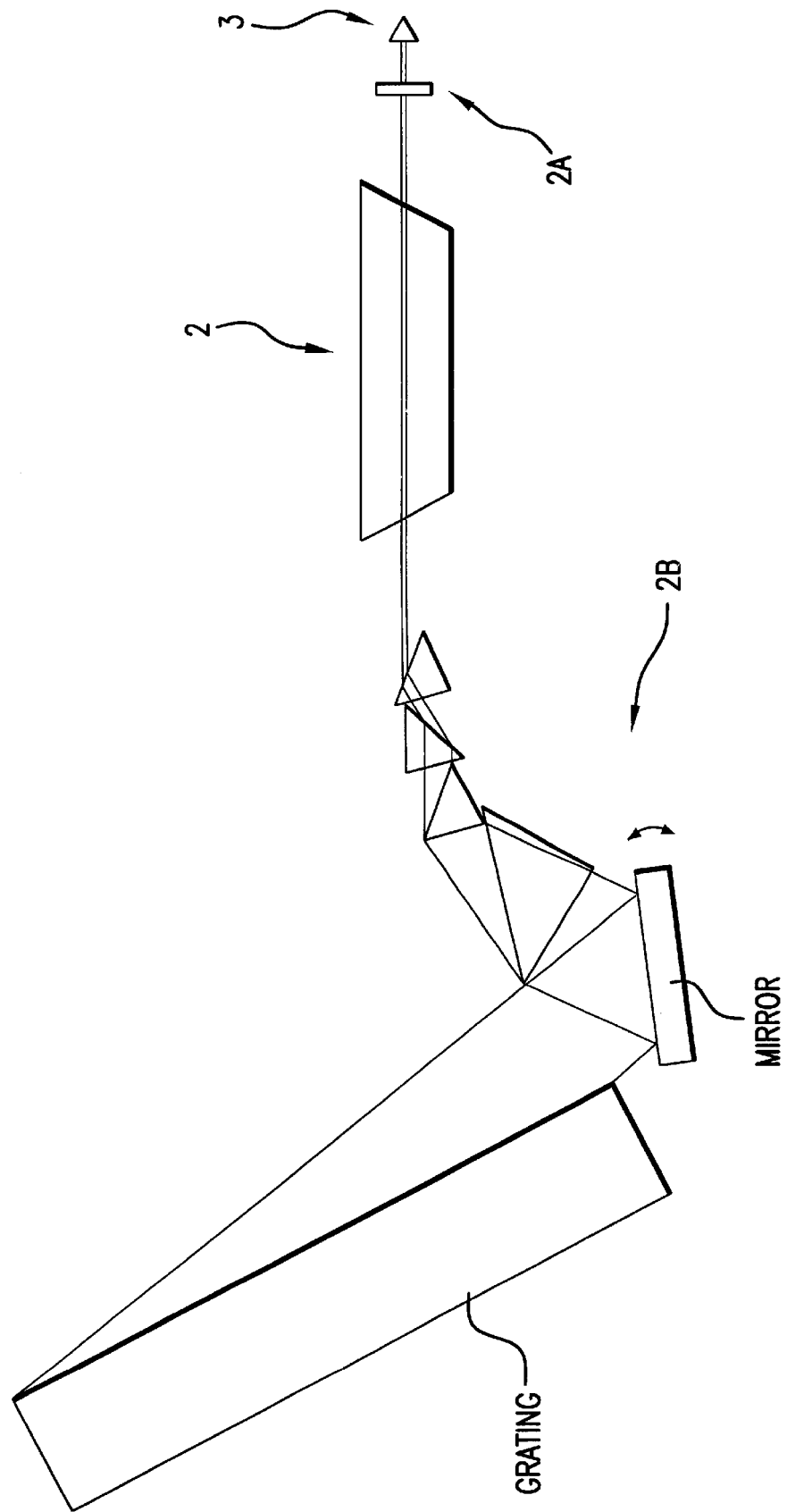
FIG. 2 shows other features of the prior art laser.

The surface of a newly fabricated prior art electrode of the type shown in FIG. 1 is very smooth. However, when viewed under a high power microscope the surface actually is comprised of longitudinal rows running the length of the electrode and spaced apart by about 1 to 2 microns with alternating ridges and valleys which with the bottom of the valleys being about 1 to 2 microns lower than the top of the ridges. The surface under the microscope appears as a long narrow plowed field resulting from machining operations.

Burnt-In Electrodes

The typical prior art practice when assembling a new laser system or rebuilding a laser chamber is to subject the chamber to a "burn in" phase in which the chamber is operated for about 500 million pulses. At 2000 Hz this requires about 70 hours. During this period, substantial sputtering occurs on the discharge surface of each electrode. The discharge surface is about 3.0 mm wide and about 500 mm long on each electrode. The sputtering occurring on the discharge surfaces of the electrodes and the discharges between the electrodes substantially alters the surface of the electrodes on the discharge portion of the surfaces. The "plowed rows" are no longer apparent afer "burn-in" but are replaced mostly by relatively randomly spaced shallow blob indentations typically about 5 microns deep and about 3 to 10 microns wide. These blob-shaped indentations or craters are spaced close together (or slightly overlapping) on the cathode. They are typically somewhat farther apart on the anode so that there are about four times as many per area on the cathode as compared to the anode.

Erosion

Applicants have discovered that electrode erosion occurs on both electrodes but that the erosion rate of the grounded electrode (anode 83) is about four times that of the high voltage electrode (cathode 84). Also, operation normally results in an insulating layer of metal fluorides being built up very gradually on portions of the anode. In some cases near the end of life of the electrodes, the portion of the discharge surface covered by the layer can be between 50% and 80% or more. In the regions covered by the fluoride layer discharge current flows through tiny holes which typically tend to have approximately circular cross sections with diameters of about 50 to 100 microns. The surfaces covered by the fluoride layer do not suffer substantial further erosion but the erosion rate is increased on the non-covered discharge surfaces as the non-covered surface area decreases. (There appears to be some erosion on the covered surfaces at the locations of the tiny holes.) Electrode erosion and fluoride build up in prior art lasers typically becomes so severe that at about 5 to 10 billion pulses, the laser beam no longer meets quality specifications. At this time typically the laser chamber is replaced with a chamber with new electrodes. A replacement chamber costs several thousand dollars and replacement requires a temporary shutdown of integrated circuit production.

Most electric discharge lasers used for integrated circuit lithography utilize brass as the electrode material. Many other materials have been tested in efforts to discover better electrode material, but to the best of Applicant's knowledge none have been proven to be better than brass taking into consideration all costs including cost of laser manufacture and cost of operation. However, recent tests by Applicants' indicate that a high strength copper material containing submicron clumps of $Al_2O_3$ sold under the trademark GLID-COP® and available from OMG Americas with offices in Research Triangle Park, N.C., erodes substantially slower than the prior art brass electrodes. Many otherwise excellent electrode materials (low sputter and evaporation loss) are not compatible with the extremely reactive fluorine gas in these chambers.

Sputtered Metal Ions—Important Part of Discharge

In order to create a good laser active media, a uniform discharge plasma must be created between the electrodes. Initially the gas in the gap between the electrodes is preionized with preionizer 12 shown in FIG. 1. As the voltage builds up on the electrodes a substantial portion of the plasma, in the regions close to the cathode is produced by ion sputtering of the electrode material. Metal atoms sputtered from the electrodes are mostly in vapor form and a substantial portion of the metal atoms are ionized and help form a positive ion cathode "fall" region immediately adjacent to the surface of the cathode creating an extremely large electric field which may contribute to the flow of electrons from the cathode and also accelerates electrons leaving the cathode. This process applies first to cathode 84 during the first portion of each pulse. However, because the polarity of the electrodes switch about halfway through the pulse, as shown in FIG. 4B, this effect also occurs at anode 83 which at that time functions as a cathode (i.e., the negative electrode). Both during and after the pulse the metal ions may be attracted back to the electrodes depending on the rapidly changing electric field conditions, but many are blown away by the circulating laser gas because some of the ejected electrode material is transported beyond the gas flow boundary layer. Applicants have estimated the erosion loss at the anode at about 3 grams per billion pulses or about $3 \times 10^{-9}$ grams per pulse which corresponds to about $2.8 \times 10^{13}$ atoms per pulse. Since there are about 1500 mm$^2$ of discharge surface on the anode, the loss is about $1.2 \times 10^{10}$ atoms per mm$^2$ per pulse. Since each atomic layer of the brass electrodes contains about $3 \times 10^{13}$ atoms per mm$^2$, an atomic layer is lost from the anode with about 2,250 pulses (a little more than one second at a 2,000 Hz pulse rate). After 10 billion pulses about 4.4 million atomic layers are lost corresponding to a reduction of about 0.5 mm in the vertical position of the discharge surface of the electrode. In prior art electrodes of the type shown in FIG. 1, this reduction is accompanied by a widening of the discharge region on the surface of the electrodes, especially the anode, and a widening, displacement or splitting of the discharge, and a buildup of fluoride layers on portions of the anode discharge surface. This normally has a substantial adverse effect on the quality of the laser beam produced by the laser.

Issues

There are five important issues to deal with in developing a better electrode for electric discharge lithography lasers using fluorine containing laser gas:

1) electrode erosion seriously affects beam quality,
2) electrode erosion currently limits laser chamber life,
3) anode erosion is about four times cathode erosion,
4) fluoride layer buildup on the anode is a problem, and
5) maintaining good gas flow conditions in the discharge gap is very important.

The various embodiments of the present invention described herein deal with these issues. The electrodes satisfy the following criteria:

1) the electrodes comprise an erosion surface which erodes slowly over several billion laser pulses with the erosion not substantially affecting beam quality,
2) the erosion surfaces resists fluoride insulation buildup on discharge regions, and
3) the electrodes are designed to provide improved gas flow to permit repetition rates of 1,000 Hz to 6,000 Hz or greater without substantial turbulence in the discharge region, or stagnation zones immediately adjacent to the discharge region.

First Preferred Embodiment (Microscopic Peaks and Cavities)

Figure 5:
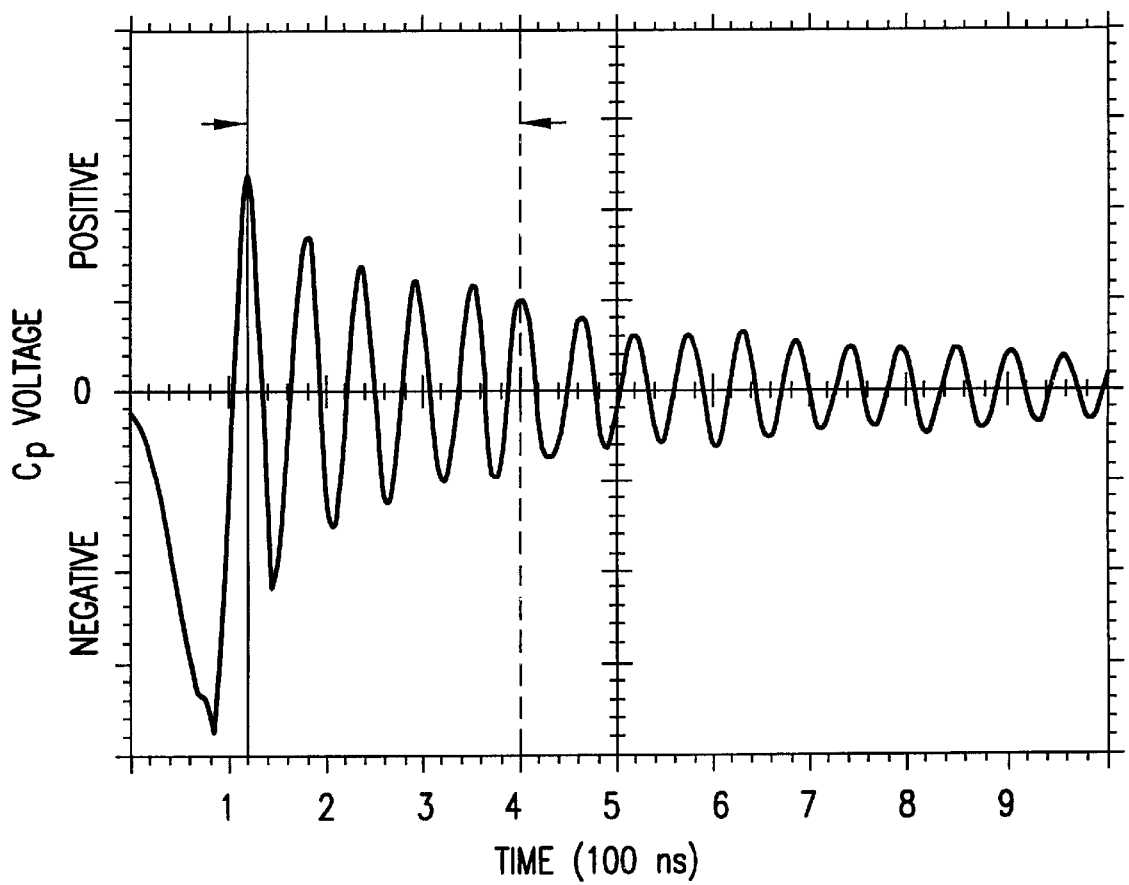
FIG. 5 is an oscilloscope chart with a fluorine-free noble chamber gas.

One of the Applicants has performed an experiment in which he operated a new ArF laser chamber (with new electrodes) without fluorine (with a gas mixture of about 1% argon and the rest neon at about 3 atmospheres) for a period of about 300 million pulses. The purpose of the experiment was to determine the extent to which electrode erosion was due to fluorine in the gas. With no fluorine the plasma between the electrodes remains highly conductive for more than a millisecond and the electron flow rings back and forth between the electrodes as indicated in FIG. 5 which is an oscilloscope plot of the $C_p$ voltage. The period of the oscillation is about 57 ns after the discharge starts with the cathode 83 and anode 84 alternately functioning as the cathode. The reader is urged to compare this graph with the $C_p$ graph shown in FIG. 4B. Note that with fluorine in the gas the ringing is effectively clamped out after one cycle.

Microscopic Craters and Peaks

Figure 5A:
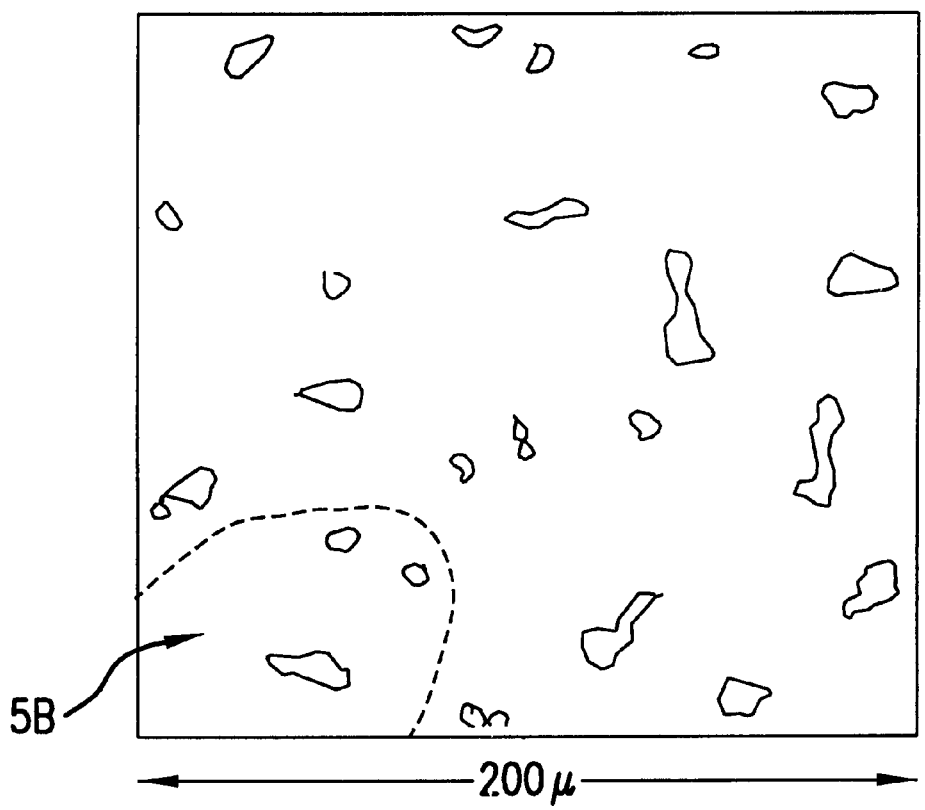
FIGS. 5A and 5B are drawings showing microscopic peaks.
Figure 5B:
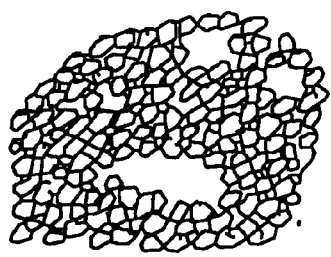

When Applicants examined the electrodes after 300 million pulses in the fluorine-free ArNe mixture, it was observed that the discharge surfaces of both the cathode and anode had developed a remarkably uniform matrix of sputter craters and discharge peaks. FIG. 5A is a drawing showing the features observed in a 200 micron×200 micron section of the cathode discharge surface under a high power microscope focused near the tops of the peaks on the surface. The very small depth of focus causes blurring of the more numerous craters. FIG. 5B is a drawing of the microscopic image of a small section of the FIG. 5A image as shown at 5B in FIG. 5A with the microscope focused near the tops of the craters showing the crater rims. When focused about 5–10 microns below the rims the features in focus appears as small dots located near the center of the rim circles. The craters on both the anode and the cathode are about 5 to 10 microns wide and about 5 to 10 microns deep and the peaks are about 25–30 microns wide and about 25–30 microns tall. Some of the peaks have a little crater at its top. The peaks are separated by about 50 microns on the cathode and are farther apart on the anode. There appears to be about 50 peaks per mm$^2$ on the anode and about 500 peaks per mm$^2$ on the cathode. There are roughly 50 craters for each peak on both the cathode and the anode. Thus, the 1500 mm$^2$ discharge region of a treated cathode may have about 750,000 peaks and about 37 million craters and on the 1500 mm$^2$ discharge region of the anode there are about 75,000 peaks and about 3.7 million craters.

Applicants have concluded based on these observations that the 5–10 microns wide 5–10 microns deep craters are caused by ion sputtering when a very high electrical potential exists near the surface of the electrodes. Sputtering on the cathode probably occurs primarily during the half of the pulse cycle when the cathode is charged negatively with respect to the anode and sputtering on the anode probably occurs primarily during the time after the polarity reversal when the anode is functioning as a cathode. When each of the electrodes is functioning as a cathode, many of the sputtered copper and zinc atoms are positive ions and are accelerated toward the electrode helping to create a cathode fall region but as the polarity begins to shift the positive metal ions are repelled away from the "cathode" surface in a direction perpendicular to the surface.

Applicants are not certain as to the mechanism by which these microscopic craters and peaks are formed but believes that both the craters and peaks contribute to improve performance of the electrodes via field enhanced emission.

After the discovery of the craters and peaks produced with the fluorine-free gas mixture, Applicants examined electrodes which were first operated in the normal $F_2$, Kr and Ne and $F_2$, Ar and Ne gas mixtures and discovered similar craters and peaks on electrodes removed after various periods of operation, but the craters and peaks were not nearly so well defined. In fact, they were so poorly defined that most observers viewing the surfaces under a microscope had difficulty identifying the peaks and craters. Fluorine inhibits the formation of a uniform discharge surface on the electrodes. Once this uniform structure has formed, however, it persists even in the presence of fluorine.

Based on the above observations and some additional tests in an electrode test chamber, Applicants have determined that electrode performance is substantially improved by a pretreatment comprised of about 50 million to 300 million pulses in a substantially fluorine free light and heavy noble gas (such as neon and krypton or neon and argon) environment. This treatment produces roughly 100,000 microscopic peaks and 5 million microscopic craters on the cathode and roughly 10,000 microscopic peaks and 0.5 million microscopic craters on the anode. Applicants do not know for certain the precise mechanism by which these microscopic peaks and craters improve performance but they suspect that the mechanism relates to the much much larger electric fields in the close vicinity of the peaks. Applicants also suspect that the shape of the craters help control the cathode sputtering and result in a reduction in the loss of metal from the cathode normally caused by sputtering. The 5 to 10 micron diameters may correlate to the distance a sputtered ion travels during the approximately 28 ns when it is being repelled from the elctrode surface. If this is the case, ions repelled from the walls of a crater may be located near the opposite wall when the electrode becomes attractive again due to polarity reversal. Many ions repelled from the bottom of the crater are probably lost from the crater so that the depth of the crater increases until the electrode field at the crater bottom decreases enough that sputtering from the bottom becomes relatively insignificant. These small shallow cavities based on the three atmospheres gas pressure of the laser chamber are about a factor of 10 larger than classical cavities of the hollow cathodes referred to in the background section. However, Applicants suspect that an effect similar to the hollow cathode effect may produce enhanced sputtering in the cavities and enhanced capture of the sputtered metal atoms. Arrays of hollow cathodes in some situations can result in a factor of 50 reduction in erosion as compared to a smooth cathode. Applicants suspect that the approximately 25 to 30 micron tall peaks may evolve from much smaller randomly occurring peaks which become discharge points then attract positively sputtered metal ions during discharges when very large attractive fields exist near the peaks. Applicants suspect that if the peaks get too large they would be vaporized (by the heat of increased current flow) down to the equilibrium size of about 20 to 30 microns. When the electrodes are operated in the absence of fluorine, which is extremely chemically active, the surface automatically evolves to that with a greatly reduced erosion rate.

Applicants tests performed in an electrode test chamber designed to simulate actual electrode discharge conditions indicate major improvements from no fluorine pretreatment. Electrode samples pretreated with 99% Ne and 1% Ar were compared with electrodes pretreated in the prior art manner in a gas mixture of 98.9% Ne, 1% Ar and 0.1% Fl. After pretreatment the electrode samples were tested for a time equivalent to 10 billion pulses, both under exactly the same conditions. The result confirmed by several separate experiments was an approximately 50% reduction in the erosion of the electrodes pretreated with the fluorine-free gas.

The conclusion of these experiments is that electrode erosion can be dramatically improved by pretreatment of smooth electrode surfaces to provide small peaks and craters on the discharge surface, which evolve naturally in the absence of fluorine. When fluorine is present, metal fluoride structures develop sporadically on the electrode surface and greatly reduce the homogeneity of the laser gas discharge.

Second Preferred Embodiments (Macroscopic Peaks and Cavities)

Figure 6A:
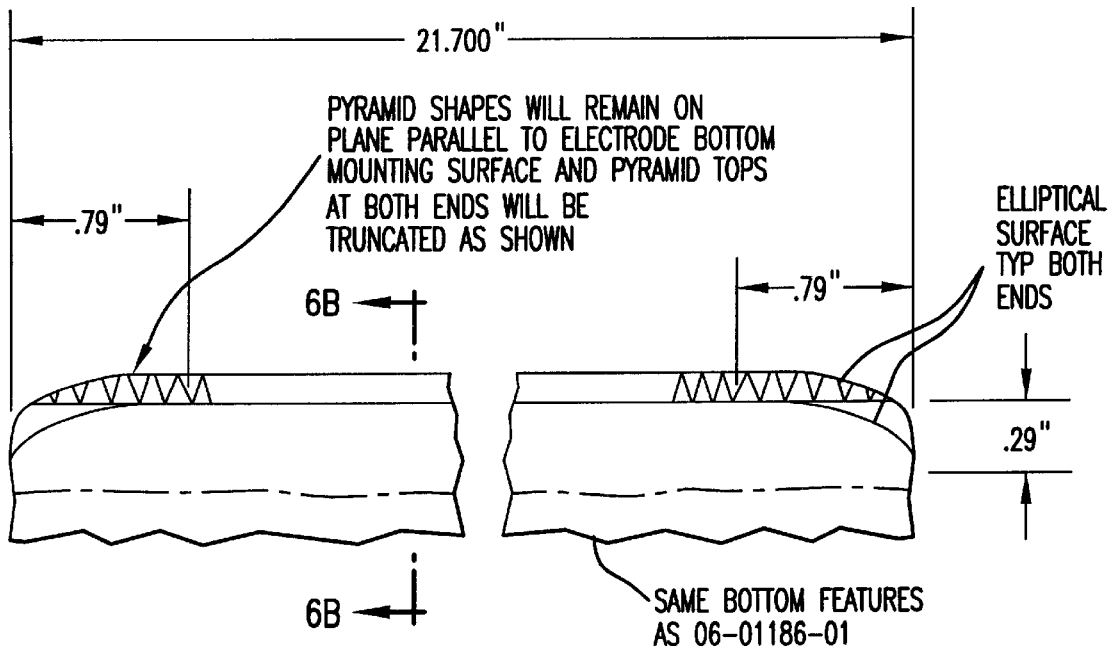
FIGS. 6A, 6B, C, D and E describe a preferred embodiment.
Figure 6B:
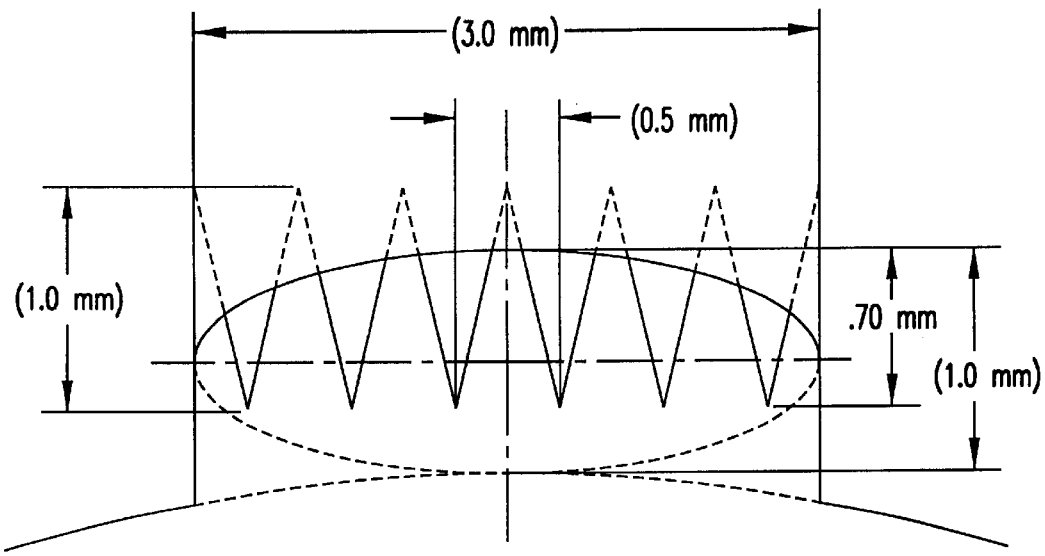
Figure 6C:
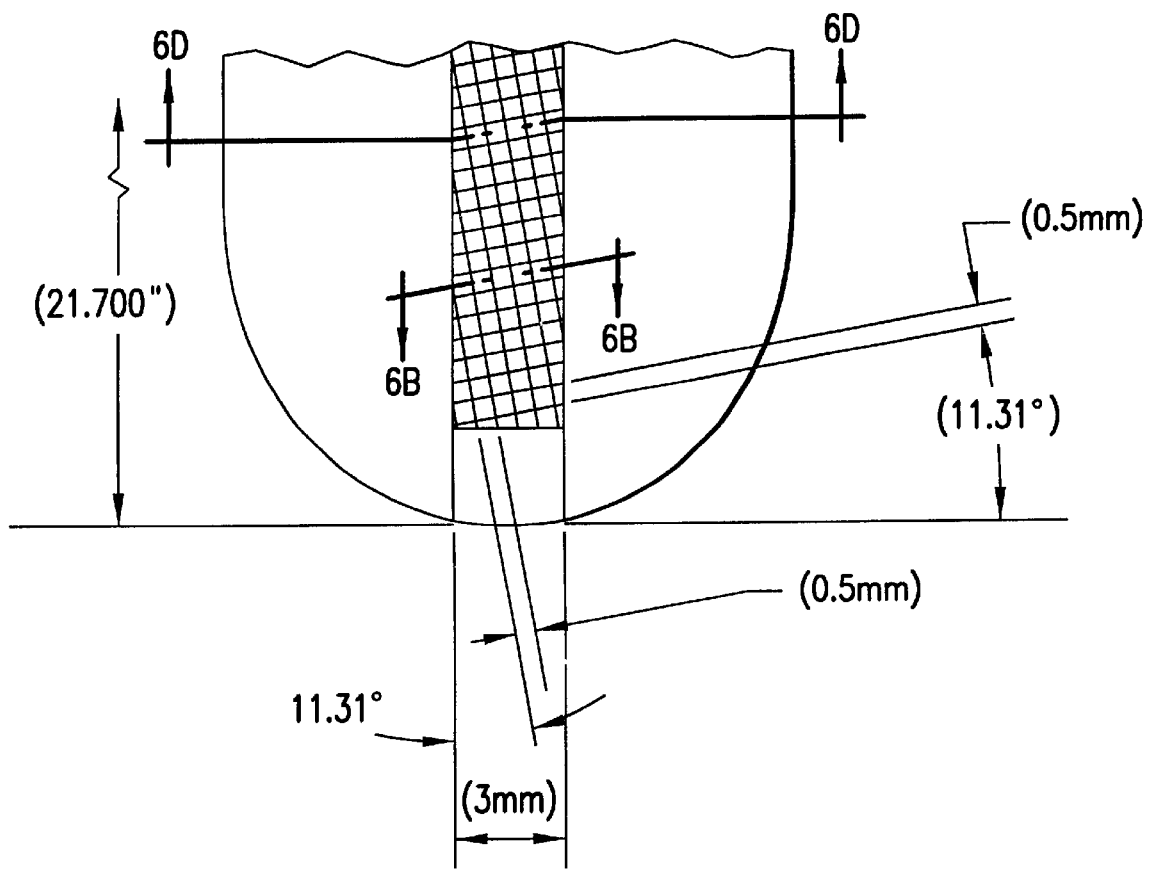
Figure 6D:
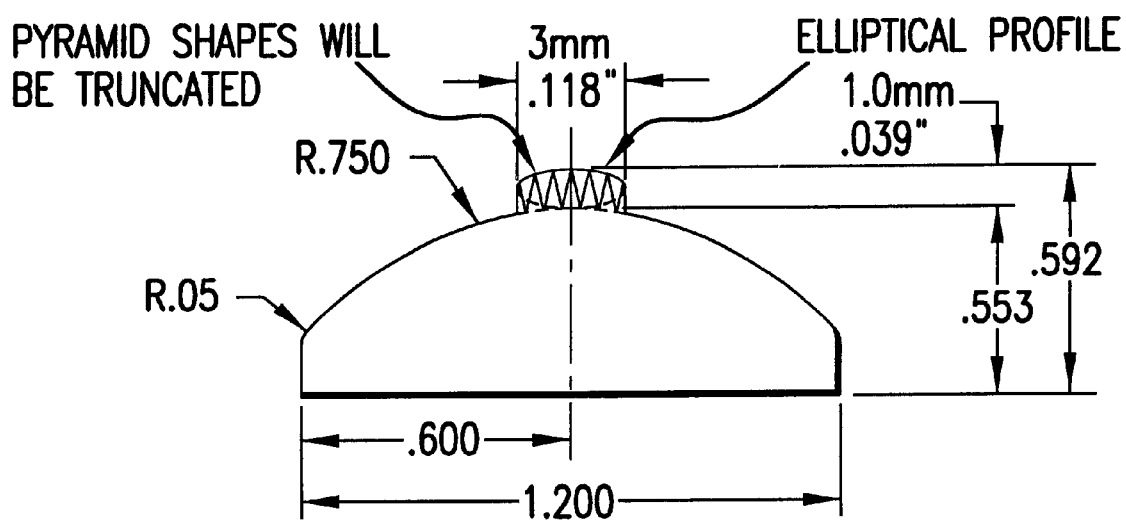
Figure 6E:
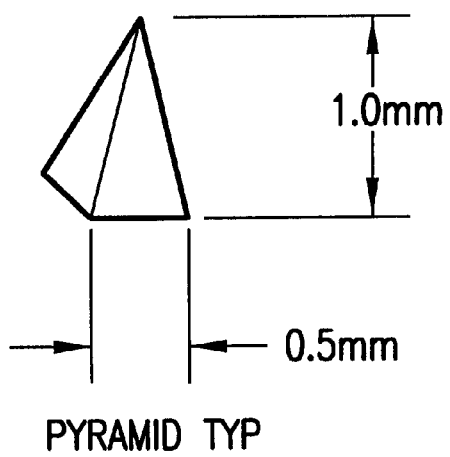

A second preferred embodiment built and tested by Applicants can be described with reference to FIGS. 6A, B, C, D and E. In this embodiment, an array of about 7,000 pyramids were machined onto the surface of a prior art electrode. The pyramids were then truncated to produce 7,000 truncated pyramids. FIG. 6A shows a side view of the electrode and FIG. 6C shoes a top view of one end section of the electrode and the positions of the pyramids. FIG. 6D shows a cross section view before the pyramids are truncated and FIG. 6E shows the general shape of the pyramid. FIG. 6B shows a cross section view cut through the center of a row of the truncated pyramids. The reader should note that truncating the pyramids produces four high field discharge points on each pyramid increasing the number of high field macroscopic discharge points from about 7,000 to about 28,000 which is a significant fraction of the number of microscopic peaks observed on the specially treated anode discussed and a small fraction of the sputter cavities on the specially treated cathode. These electrodes have been tested and the tests to date demonstrate an excellent discharge pattern.

In a preferred embodiment the electrodes fabricated as described above in this section are pretreated as described in the previous section to put microscopic peaks and cavities on top of the macroscopic peaks and cavities. Another approach is to not truncate the pyramids.

Third Embodiment (Blade Electrodes)

Figure 9:
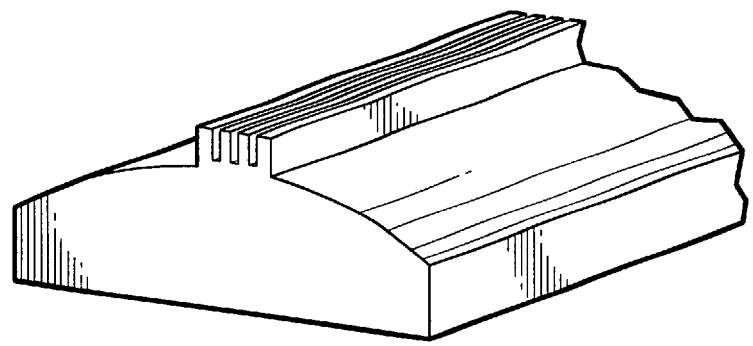
FIGS. 9, 10, 9A and 10A show embodiments using blade electrodes.
Figure 9A:
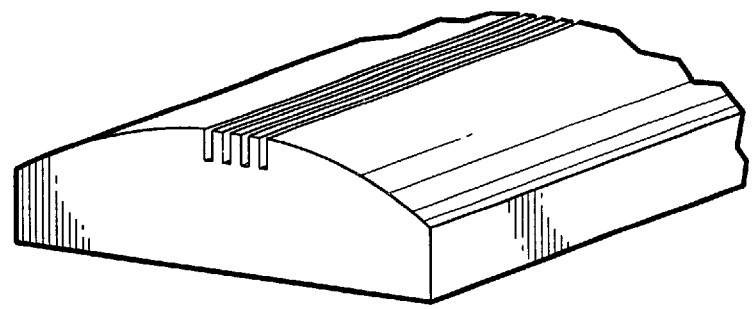
Figure 10:
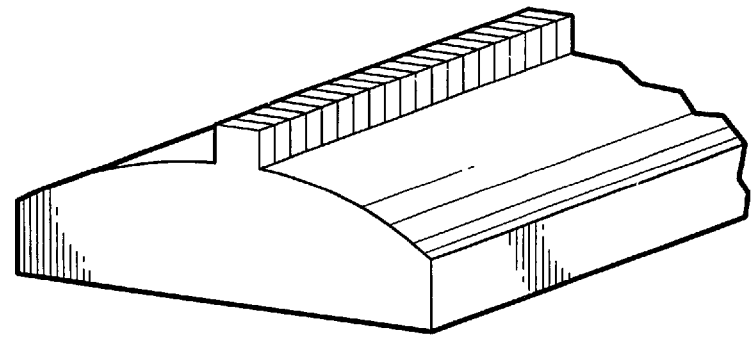
Figure 10A:
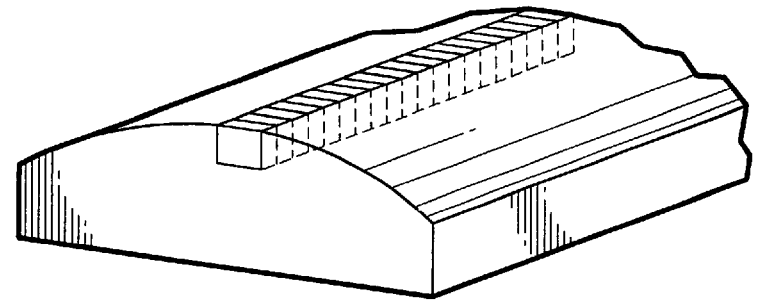
Figure 11:
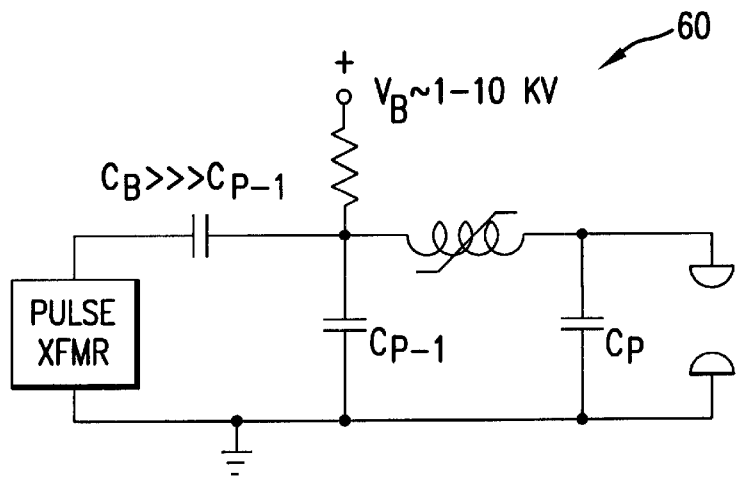
FIG. 11 shows a circuit for applying a negative bias to an anode.
Figure 12:
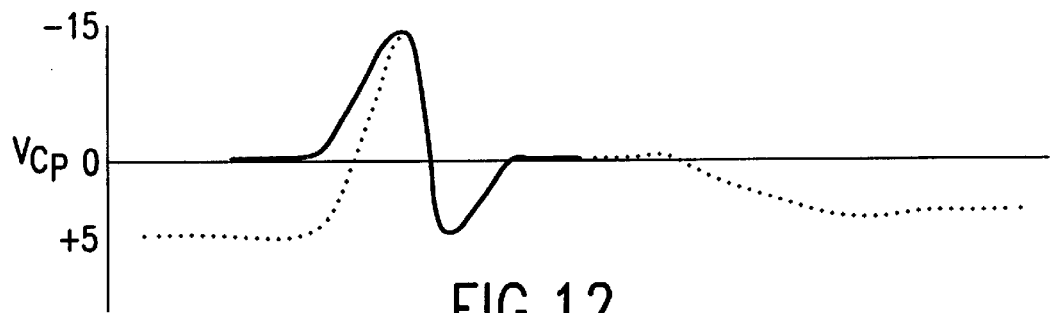
FIG. 12 shows the modification in the electrical pulse shape caused by the bias.

Blade electrodes may be provided to define the discharge surface of the electrodes. These blades produce very high electric fields in the immediate vicinity of the blade tips which will concentrate the discharge on the tips of the blades. The blades may be parallel to the longitudinal axis of the electrodes as shown in FIG. 9 or they may be parallel to the direction of flow as shown in FIG. 10. The blades may extend above the upper surface of the electrode base as shown in FIGS. 9 and 10 or they may be cut below the upper surface of the electrode base as shown in FIGS. 9A and 10A. Or the blades could extend both above and below the surface. In the FIG. 9 and FIG. 9A cases the blades preferably are about 0.01 to 0.020 inches wide and with spaces between them of about 0.005 to 0.010 inch. The array of blades should preferably be about 2 to 5 mm wide. For the FIGS. 10 and 10A type blades the thickness, the spaces between the blades and the thickness of the blade array preferably would be in the same range as described above for the longitudinal blades.

Figure 7B:
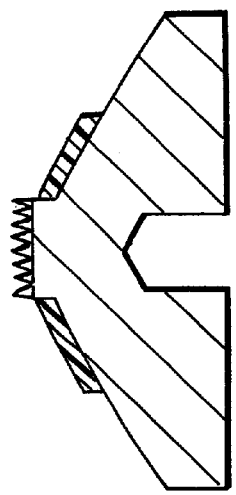
FIGS. 7A, 7B, 7C, 7D, 7E, 7F, 7G, 7H and 7I show embodiments of the present invention.
Figure 7C:
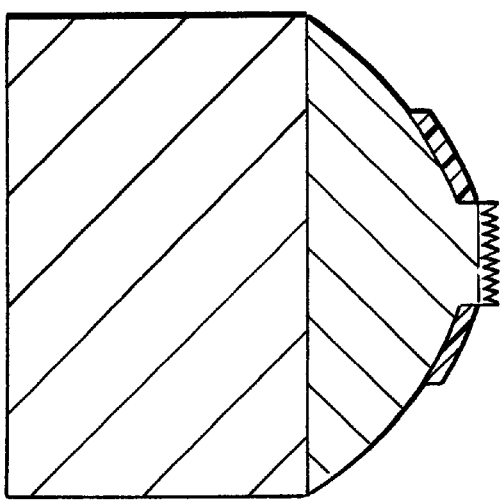

In the FIG. 9 case insulating spacers may be provided to improve the flow over the blades. In the case of the FIGS. 9A and 10A embodiments the adjacent surfaces of the electrode base could be covered with insulating material as shown in FIGS. 7B, 7C and 7D to further discourage any significant spreading of the discharge surface.

Other Embodiments

Many other electrode configurations are possible utilizing the principals of this invention to provide a long life electrode for gas discharge lasers. FIGS. 7A through 7I show other examples in which discharge peaks and sputters cavities are provided in arrangements which provide minimum interference with gas flow while providing many high field discharge points and the sputter metal ionization needed to promote stable and homogenous dischargers.

Figure 7A:
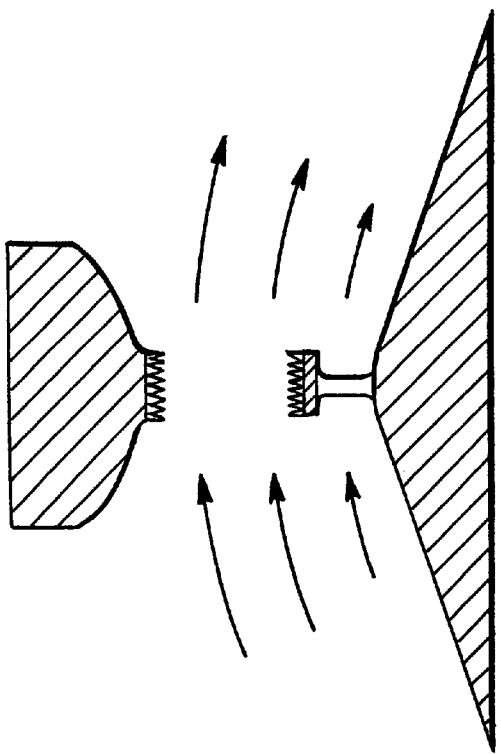
Figure 7D:
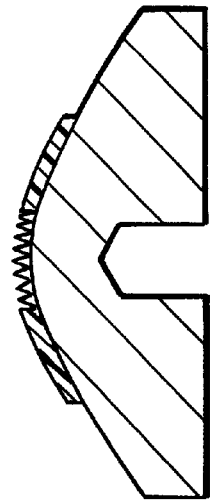
Figure 7E:
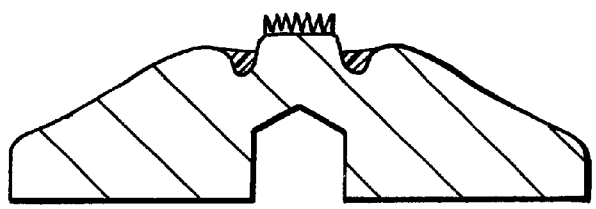
Figure 7F:
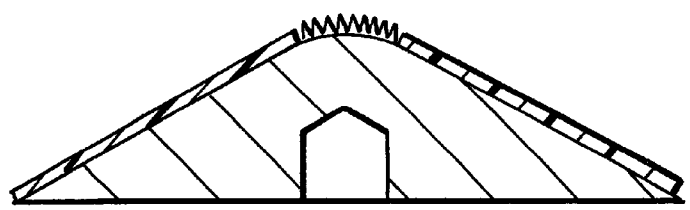

FIG. 7A shows an embodiment in which the cathode is similar to the one shown in FIGS. 6A through 6E but the anode is suspended above an anode support on tiny pilings spaced at 2 cm intervas to permit gas to flow under an anode section comprising the discharge surface. Pyramids are provided on both the cathode and the anode.

Figure 7G:
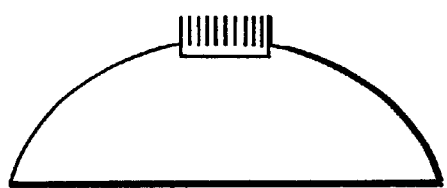
Figure 7H:
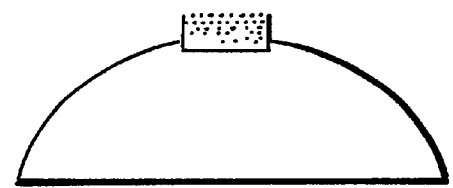
Figure 7I:
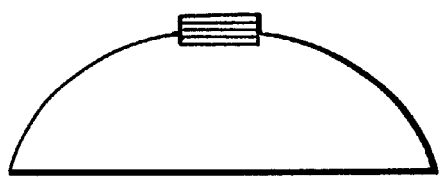
Figure 8:
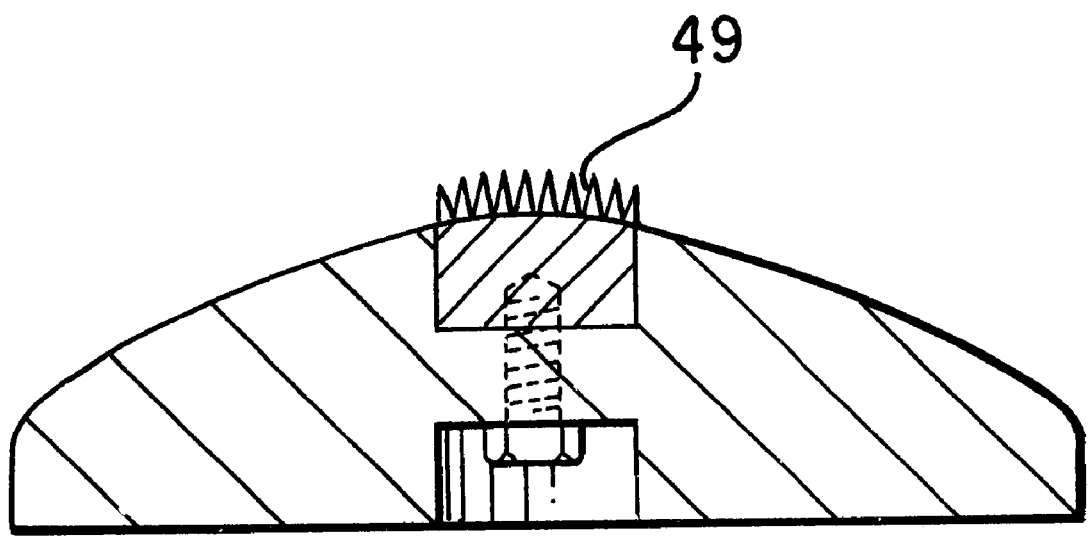
FIG. 8 shows an electrode composed of two different conductor materials.

FIGS. 7B, C, D, E and F show embodiments in which electrodes are provided with discharge surfaces covered with arrays of pyramids and the discharge surfaces are bounded by insulator covered surfaces. The discharge surfaces in the embodiments shown in FIGS. 7G, 7H and 7I are formed with arrays of extremely thin metal wire with diameters in the range of about 25 microns to about 500 microns. The wire material may be any good electrode material such as brass or copper. In FIG. 7G, the wires are aligned vertically, in FIG. 7H they are aligned with the long direction of the electrode and in FIG. 7I they are aligned in the flow direction. The arrays preferably are braised together and to the electrode base. The spaces between the wires provide the discharge cavities and the wires themselves provide localized high field discharge peaks. FIG. 8 shows an example where a good conductor material with discharge peaks is mounted in an electrode support made of lossey electrode material with poor conductivity.

Dealing With The Metal Fluoride Issue

As stated above, Applicants have learned that metal fluoride layers build up on the anode very gradually over electrode life. The fluoride layer does not build up on the cathode. This material (copper fluoride and zinc fluoride) is an insulator and it interferes with the discharge. The interference, however, is not complete because tiny holes appear in the layer spaced about 0.1 to 1.0 mm apart and current flows into and out of those holes. Furthermore, the fluoride layer prevents further erosion on the surfaces it covers. Apparently, however, the current flow through the holes in a fluoride covered section is not as efficient as the current flow in a non-covered section of the discharge surface. With these discoveries Applicants have developed several solutions to the fluoride issue on the anode.

Insulate the Anode

One solution is to fabricate the anode with an insulating coating but provide a large number of discharge cavities through the insulation layer. Preferably, the holes should be very small, less than 200 microns and spaced apart by about 0.5 mm.

Alternate Electrode Polarity

Another solution to the fluoride on the anode problem is to periodically switch the polarity of the two electrodes. This can easily be accomplished fairly simply by switching the leads out of pulse transformer 56 shown in FIG. 3 and making sure that the bias circuits 120 and 126 are arranged properly. Preferably, the polarity should be switched at intervals no longer than about 100 million pulses so that any anode buildup will be minimal between changes in polarity. With this technique, the small amount of fluoride buildup on an electrode when it is functioning primarily as the anode is burned off when the electrode is functioning as the cathode. However, this method does not restore the electrode surface completely to the structure it develops when initially run with no fluorine.

Apply Negative Bias To Anode

Figure 13:
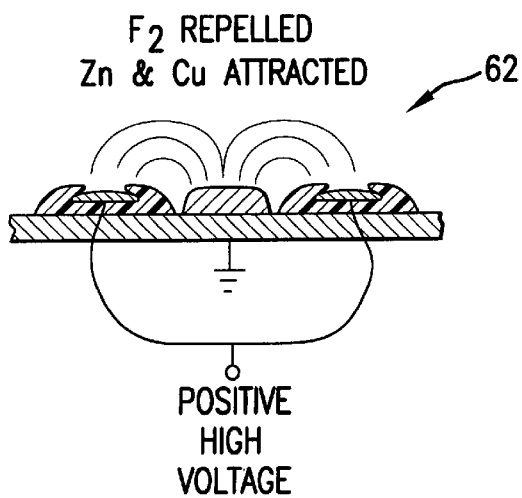
FIG. 13 shows a schematic for applying an external electric field to an electrode to repel $F_2$ and attract metal ions.

Another solution to the fluoride buildup is to apply a negative bias to the anode so that it is charged negatively at least immediately after the pulse. This will have the effect of applying a repelling force on fluorine ions (which are typically negative ions) after the pulse and will substantially reduce the fluoride buildup on the anode. This negative bias will also help recapture on the anode sputtered routine metal ions immediately after the pulse and therefore contribute to a substantial decrease in the erosion rate of the anode. A simple modification to the circuit shown in FIG. 3 is shown in FIG. 13. A positive bias voltage of between 1 and 10 kv is applied as shown at 60. A blocking capacitor having capacitance much much greater than $C_{p-1}$ prevents the bias voltage from interfering with the discharge pulse and a large resistance in the bias circuit limits the bias current flow during discharge. FIG. 14 shows the effect of the beam circuit on the discharge pulse. The modified pulse is shown as a dotted line.

Periodic Operation Without Fluorine

Another potential method of reducing the fluoride layer buildup is to operate the laser for short periods without fluorine. Applicants have conducted experiments which show that operating the laser without fluorine (i.e., only neon with small percentages of Kr or Ar) provides well conditioned electrode discharge surfaces and reduces the subsequent erosion rate. During normal operation the laser gas is exchanged periodically (about once each 3 or 4 days). Operation for a few minutes without F2 could possibly be accomplished without substantial interference with factory operation. As stated above, without fluorine the discharge rings back and forth between the electrodes for many cycles with both electrodes alternatingly functioning as the cathode. This operation should bum off thin fluoride layers that might have built up on the anode since the previous gas replacement. While expected to provide an improvement, this method cannot completely restore the emission surface structure obtained using the pretreat method.

Secondary Electrode Field

Another approach to solve the fluoride buildup problem and to reduce erosion is to establish a secondary electric field which will induce a negative ion flow away from the electrode and induce a positive ion flow toward the electrode at least during a short period immediately following the pulse. This can be accomplished by locating one or more electrodes near the anode discharge surface but outside the discharge region and charging it to a positive value in order to create an electric field which will repel negative fluorine ions from the anode and attract positive metal ions. Such a circuit is shown in FIG. 15. A positive high voltage such as +5000 V is applied to partially insulated electrodes on both sides of the anode which is at ground potential. An approximate representation of electric field lines are shown at 62 in FIG. 15. This circuit could be kept "on" continuously or it could be turned on for short intervals to over-lap or follow quickly the regular pulse.

While the invention has been described above with specificity in terms of preferred embodiments, the reader should understand and recognize that many changes and alterations could be made without deviating from the spirit of the invention. It is important to maintain good flow conditions in the gap between the electrodes to clear the gap of discharge debris prior to the next pulse. At 1000 Hz the flow must be at least 5 m/sec or greater, preferably substantially greater. At 2000 Hz the flow preferably is about 25 m/s. The principals of this invention could be applied to many other gas discharge lasers other than KrF lasers such as, for example, ArF lasers, $F_2$ laser. The bias circuit does not have to be a DC. The numbers of macroscopic peaks could vary substantially from those described in the above text but the number preferably should be large. For the macroscopic discharge points, Applicants recommend at least about 400 per $cm^2$. When surfaces are prepared to create microscopic peaks, a preferred density is at least 5,000 peaks per cm² on the erodable surface. The preferred concentration of microscopic sputter cavities is at least 200,000 craters per cm². Therefore, the scope of the invention should be determined by the appended claims and their legal equivalents.

We claim:

1. A gas discharge laser comprising:
   A) a laser chamber containing a laser gas,
   B) two elongated erodable electrode elements located within said laser chamber, each electrode element having an erodable surface and an electrode support, said erodable surface having a large numb of discharge peaks and a large number of sputter cavities,
   C) a pulse power system means for providing electrical pulses of at least two Joules to said electrodes to produce electric discharges, each discharge defining region and a discharge shape,
   said electrode elements comprising an erosion means permitting erosion with each pulse gradually over at least eight billion pulses to an end-of-life shape without causing a substantial change in the discharge shape,
   D) a blower means for circulating said laser gas between said two electrodes at a velocity in excess of 5 m per second,
   E) a heat exchanger means for removing heat from said laser gas produced by said blower system and said discharge, and
   F) a gas flow guiding means to guide gas flow past said erodable electrodes.

2. A laser as in claim 1 wherein said large number of discharge peaks on said erodable surface comprise at least about 400 macroscopic peaks per cm² of erodable surface.

3. A laser as in claim 1 wherein said large number of discharge peaks comprise at least 400 macroscopic points per cm² of erodable surface area on truncated pyramids.

4. A laser as in claim 1 wherein said large number of discharge peaks comprise a very large number of at least about 5,000 microscopic peaks per cm² of erodable surface area.

5. A laser as in claim 1 wherein said large number of sputter cavities comprise a very large number of sputter cavities of at least about 200,000 microscopic sputter cavities per cm² of erodable surface area.

6. A laser as in claim 1 wherein said large number of discharge peaks also comprise a very large number of microscopic peaks and a very large number of microscopic sputter cavities.

7. A laser as in claim 6 wherein said microscopic discharge peaks and microscopic sputter cavities are formed by causing discharges from said electrodes in a noble gas, fluorine free gas environment.

8. A laser as in claim 1 wherein said discharge peaks and sputter cavities are formed with an array of thin wires.

9. A laser as in claim 8 wherein said thin wires in said array have thicknesses in the range of about 25 microns to about 500 microns.

10. A laser as in claim 9 wherein said discharges between said electrodes define a discharge direction and said thin wires are aligned in said discharge direction.

11. A laser as in claim 9 wherein said electrodes define a long direction and said thin wires are aligned parallel with said long direction.

12. A laser as in claim 9 wherein gas flow between the electrodes define a flow direction said wires are aligned with said flow direction.

13. A laser as in claim 1 and further comprising at least one insulating spacer mounted adjacent to said erodable section of at least one of said electrode element and configured to reduce gas turbulence in the discharge region.

14. A laser as in claim 1 wherein at least one of said electrode element defines a discharge surface and insulated surfaces on two sides of said discharge surface and further comprises insulating layers disposed on said insulated surfaces.

15. A laser as in claim 14 where in said insulating layers are comprised of alumina.

16. A laser as in claim 14 wherein said insulating layer is comprised of a metal fluoride.

17. A laser as in claim 1 wherein at least one of said erodable sections are connected to its electrode support by tiny pilings permitting laser gas to flow between said erodable section and said electrode support.

18. A laser as in claim 1 wherein at least one of said electrode elements define a discharge surface and comprises trenches running longitudinal along two sides of said discharge surface.

19. A laser as in claim 18 wherein said trenches are at least partially filled with insulator material.

20. A laser as in claim 19 wherein said insulator material is chosen from a group consisting of alumina and metal fluorides.

21. A laser as in claim 1 wherein at least one of said electrode element is comprised of a first non-insulating material having high electrical conductance defining a high conductance and a second non-insulating material having a conductance of less than 70 percent of the high conductance, said first non-insulating material defining a discharge surface.

22. A laser as in claim 21 wherein said material having low electrical conductance is a lossey electrode material.

23. A laser as in claim 1 wherein at least one of said electrode elements defines a discharge surface and comprising insulating sheet disposed on two sides of said discharge surface.

24. A laser as in claim 23 wherein said insulating sheet is alumina having a thickness of about 1/16 inch.

25. A laser as in claim 1 and further comprising a current return structure configured to shape the discharge to a desired shape and further comprising insulating spacers to guide the gas flow through and beyond the discharge region.

26. A laser as in claim 1 wherein one of said two electrode functions primarily as a cathode, defining a cathode, and the other electrode functions primarily as an anode-defining an anode, and further comprising a bias circuit for applying a negative potential to said anode relative to said cathode at least during time periods following each electrical pulse.

27. A laser as in claim 1 wherein one of said two electrode functions primarily as a cathode, defining a cathode, and the other electrode functions primarily as an anode-defining an anode, and further comprising a bias circuit, including at least one conductor positioned near said anode, for applying a negative potential to said anode relative to said second conductor at least during time periods following each electrical pulse.

28. A laser as in claim 1 wherein one of said two electrode functions primarily as a cathode, defining a cathode, and the other electrode functions primarily as an anode-defining an anode, and further comprising a bias circuit, including at least one conductor configuration positioned near said anode and said cathode, for applying a negative potential to said anode and to said cathode relative to said conductor configuration.

29. A laser as in claim 28 wherein said conductor configuration comprises one or two elongated conductors located approximately equidistance from said anode and said cathode.

30. A laser as in claim 28 wherein said conductor configuration comprises one or two elongated conductors positioned near said anode and one or two elongated conductors positioned near said cathode.

31. A laser as in claim 1 wherein said erodable section is comprised of an array of blades.

32. A laser as in claim 31 wherein said laser gas circulating between said electrodes define a gas flow direction and said array of blades are disposed parallel to said gas flow direction.

33. A laser as in claim 31 wherein said laser gas circulating between said electrodes define a gas flow direction and said array of blades are disposed perpendicular to said gas flow direction.

34. A process for operating a gas discharge laser comprising;
   A) a laser chamber containing a laser gas,
   B) two elongated erodable electrode elements located within said laser chamber, each electrode element having an erodable surface and an electrode support, said erodable surface having a large number of discharge peaks and a large number of sputter cavities,
   C) a pulse power system means for providing electrical pulses of at least two Joules to said electrodes at rates in excess of 1000 Hz to produce electric discharges, each discharge defining region and a discharge shape,
   said electrode elements comprising an erosion means permitting erosion with each pulse gradually over at least eight billion pulses to an end-of-life shape without causing a substantial change in the discharge shape,
   D) a blower means for circulating said laser gas between said two electrodes at a velocity in excess of 5 m per second,
   E) a heat exchanger means for removing heat from said laser gas produced by said blower system and said discharge, and
   F) a gas flow guiding means to guide gas flow past said erodable electrodes;
   said process comprising the steps of periodically reversing the normal electrode polarity in order to burn off fluoride buildup on at least one of said electrode.

35. A process for operating a gas discharge laser comprising:
   A) a laser chamber containing a laser gas,
   B) two elongated erodable electrode elements disposed within said laser chamber, each electrode element having an erodable surface and an electrode support, said erodable surface having a large number of discharge peaks and a large number of sputter cavities,
   C) a pulse power system defining a normal electrode polarity and configured to provide electrical pulses of at least two Joules to said electrodes at rates in excess of 1000 Hz to produce electric discharges, each discharge defining region and a discharge shape,
   said electrode elements configured to erode with each pulse in a predetermined manner gradually over at least eight billion pulses to an end-of-life shape without causing a substantial change in the discharge shape,
   D) a blower system for circulating said laser gas between said two electrodes at a velocity in excess of 5 m per second,
   E) a heat exchanger having sufficient capacity to remove heat from said laser gas produced by said blower heat from said laser gas produced by said blower system and said discharge, and
   F) a gas flow guiding means to guide gas flow past said erodable electrodes without creating significant turbulence in said gas either when the electrodes are new or when the electrodes are eroded to their end-of-life shape;
   wherein said process comprises periodically operating said laser in a substantially fluorine free condition for at least a few minutes in order to burn off fluoride built up on at least one of said electrodes.

36. A process as in claim 35 wherein said substantially fluorine free operation occurs in connection with laser gas replacement.

* * * * *

UNITED STATES PATENT AND TRADEMARK OFFICE
CERTIFICATE OF CORRECTION

PATENT NO.        : 6,560,263 B1  
APPLICATION NO.   : 09/590958  
DATED             : May 6, 2003  
INVENTOR(S)       : Morton et al.

It is certified that error appears in the above-identified patent and that said Letters Patent is hereby corrected as shown below:

Column 12, Claim 14:  
Line 4, change "element" to --elements--.

Column 12, Claim 18:  
Line 16, change "define" to --defines--;  
Line 17, change "longitudinal" to --longitudinally--.

Column 12, Claim 21:  
Line 25, change "element" to --elements--.

Column 12, Claim 23:  
Line 34, before "insulating" add --an--.

Column 12, Claim 26:  
Line 44, change "anode-defining" to --anode, defining--.

Column 12, Claim 27:  
Line 50, change "anode-defining" to --anode, defining--.

Column 12, Claim 28:  
Line 58, change "anode-defining" to --anode, defining--.

Column 13, Claim 32:  
Line 8, change "define" to --defines--.

Column 13, Claim 34:  
Line 26, after "defining" add --a discharge--;  
Line 42, change "electrode" to --electrodes--.

UNITED STATES PATENT AND TRADEMARK OFFICE
CERTIFICATE OF CORRECTION

PATENT NO. : 6,560,263 B1
APPLICATION NO. : 09/590958
DATED : May 6, 2003
INVENTOR(S) : Morton et al.

It is certified that error appears in the above-identified patent and that said Letters Patent is hereby corrected as shown below:

Column 14, Claim 35:
Line 14, after "defining" add --a discharge--;
Line 24, after "blower" delete "heat";
Line 25, delete "from said laser gas produced by said blower".

Signed and Sealed this

Eleventh Day of March, 2008

JON W. DUDAS
*Director of the United States Patent and Trademark Office*